(12) United States Patent
Jaussi

(10) Patent No.: US 6,710,656 B2
(45) Date of Patent: Mar. 23, 2004

(54) HIGH GAIN AMPLIFIER CIRCUITS AND THEIR APPLICATIONS

(75) Inventor: James E. Jaussi, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/335,620

(22) Filed: Jan. 2, 2003

(65) Prior Publication Data

US 2003/0174021 A1 Sep. 18, 2003

Related U.S. Application Data

(62) Division of application No. 10/099,138, filed on Mar. 15, 2002.

(51) Int. Cl.[7] .................................................. H03F 3/45
(52) U.S. Cl. ........................................ 330/253; 330/260
(58) Field of Search ................................. 330/253, 268; 327/359, 328

(56) References Cited

U.S. PATENT DOCUMENTS

| | | | |
|---|---|---|---|
| 3,916,333 A | * 10/1975 | Zuk | 330/260 |
| 4,647,839 A | * 3/1987 | Siligoni et al. | 330/252 |
| 4,754,169 A | 6/1988 | Morris | 327/307 |
| 4,805,129 A | 2/1989 | David | 124/87 |
| 4,987,327 A | 1/1991 | Fernandez et al. | 327/543 |
| 5,043,599 A | 8/1991 | Zitta | 327/65 |
| 5,079,515 A | 1/1992 | Tanimoto | 330/256 |
| 5,148,162 A | 9/1992 | Crosby | 341/122 |
| 5,222,240 A | 6/1993 | Patel | 712/218 |
| 5,367,476 A | 11/1994 | Elliott | 708/301 |
| 5,408,235 A | 4/1995 | Doyle et al. | 341/143 |
| 5,414,311 A | 5/1995 | Carley | 327/94 |
| 5,500,811 A | 3/1996 | Corry | 708/319 |
| 5,512,848 A | 4/1996 | Yaklin | 327/65 |
| 5,517,134 A | 5/1996 | Yaklin | 327/65 |
| 5,563,598 A | 10/1996 | Hickling | 341/155 |
| 5,717,716 A | 2/1998 | Doyle | 375/232 |
| 5,777,912 A | 7/1998 | Leung et al. | 708/319 |
| 5,900,779 A | 5/1999 | Giacomini | 330/252 |
| 5,903,605 A | 5/1999 | Crittenden | 375/226 |

(List continued on next page.)

OTHER PUBLICATIONS

Baker, "Chapter 26: Nonlinear Analog Circuits," *CMOS Circuit Design, Layout and Simulation*, IEEE Press, 1998, pp. 685–699.

Ellersick et al., "GAD: A 12–GS/s CMOS 4–bit A/D Converter for an Equalized Multi–Level Link", *1999 Symposium on VLSI Circuits Digest of Technical Papers*, 1999, pp. 49–52.

Farjad–Rad et al., "A 0.3 μm CMOS 8–Gb/s 4–PAM Serial Link Transceiver," *IEEE J. Solid State Circuits*, 2000, 35(5): 757–764.

Yang et al., "A Scalable 32Gb/s Parallel Data Transceiver with On–chip Timing Calibration Circuits", *2000 IEEE International Solid–State Circuits Conference*, Digest Of Technical Papers, 2000, pp. 258–259.

Primary Examiner—Khanh Van Nguyen
(74) Attorney, Agent, or Firm—Fish & Richardson P.C., P.A.

(57) ABSTRACT

A high gain amplifier circuit includes two differential transistor pairs and a current generator coupled to each differential pair to control tail current. Each differential transistor pair has a first transistor and a second transistor and an output node for each. Bias terminals of the first transistors serve as inputs for the amplifier circuit. The output node of each first transistor serves as an output for the amplifier circuit and is respectively coupled to the bias terminal of the second transistor of the same differential pair. The amplifier circuit has applications in a comparator circuit that also has a load circuit, which may have active components or only passive components. The amplifier circuit may also be used as a sense amplifier in a receiver of a communications system.

17 Claims, 5 Drawing Sheets

U.S. PATENT DOCUMENTS

| | | | |
|---|---|---|---|
| 5,966,314 A | 10/1999 | Lee | 708/319 |
| 5,990,737 A | 11/1999 | Czarnul et al. | 330/69 |
| 6,018,269 A * | 1/2000 | Viswanathan | 330/253 |
| 6,064,614 A | 5/2000 | Khoury | 365/207 |
| 6,151,415 A | 11/2000 | Acharya et al. | 382/255 |
| 6,163,215 A | 12/2000 | Shibata et al. | 330/254 |
| 6,209,069 B1 | 3/2001 | Baltar | 711/163 |
| 6,275,835 B1 | 8/2001 | Pisek et al. | 708/300 |
| 6,288,588 B1 | 9/2001 | Frisch | 327/380 |
| 6,348,882 B1 | 2/2002 | Ciccone et al. | 341/56 |
| 6,388,521 B1 | 5/2002 | Henry | 330/258 |
| 6,396,329 B1 | 5/2002 | Zerbe | 327/336 |
| 6,420,932 B1 | 7/2002 | Casper | 330/258 |
| 6,469,576 B2 | 10/2002 | Hasegawa | 330/69 |

* cited by examiner

HIGH GAIN AMPLIFIER CIRCUITS AND THEIR APPLICATIONS

CROSS RELATED APPLICATIONS

This is a divisional application of U.S. Ser. No. 10/099,138, filed Mar. 15, 2002.

TECHNICAL FIELD

The invention is related to amplifier circuits and applications of such circuits.

BACKGROUND

Amplifier circuits are used to amplify an input electrical signal to provide current or voltage gains or reductions. They may be used to amplify a single ended or a differential signal. In addition, when used in conjunction with an output regenerative latch stage that provides positive feedback and an increase in gain, amplifier circuits can provide a digital output signal (having one of two stable states) that is an indication of a comparison between two single ended input signals or a determination of the magnitude of a differential signal. A basic component of many amplifier circuits is the differential transistor pair used as the input stage of the amplifier.

Most practical implementations of amplifier circuits suffer from manufacturing process-induced variations in the structure of the circuit devices, which cause an offset in the amplifier's operation. The offset may be explained by, for instance, considering an amplifier that is designed to amplify a differential input signal. In some applications, the output of the amplifier would ideally be zero volts if the input differential signal was zero volts. However, in practice, a zero voltage differential signal often yields a small but nevertheless non-negligible output offset voltage. Output offset may be corrected using a wide range of techniques known as offset cancellation techniques. In one such technique, the value of the input differential signal that actually yields a zero output voltage is measured and stored, and then is subsequently subtracted from each new input signal to thus cancel the offset of the amplifier. In other applications of amplifier circuits, such as a pre-amplifier circuit that is used in a comparator circuit, amplifier circuits are designed to have a specified offset so that a comparison is indicated only when the offset is overcome.

The trend in circuit design is toward smaller and smaller device sizes, which serves not only to minimize space consumption, but also to minimize the capacitance and hence maximize the speed of circuits that incorporate the devices. However, with smaller device sizes, process-induced variations become more of an issue because the probability for process-induced variation in the structure of a device becomes greater as device size becomes smaller.

DESCRIPTION OF DRAWINGS

Like reference symbols in the various drawings indicate like elements.

DETAILED DESCRIPTION

The invention provides for amplifier circuits having high gain due to positive feedback. The amplifier circuits employ two differential transistor pairs and a current generator for each to provide tail current. Bias terminals of a first transistor of each differential pair receives input signals, and output nodes of these same transistors serve as outputs of the amplifier circuit. These output nodes are coupled to provide positive feedback in amplifier gain. Another feature in some embodiments of the invention is an ability to vary the offset in the amplifier circuit's operation, either to compensate for unintended offset created by process-induced variations or to produce a specified offset needed for proper circuit operation. In other aspects, the invention provides circuit applications for the high gain amplifier circuits, including for example, a comparator circuit and a communications system in which the comparator circuit is used.

Figure 1:
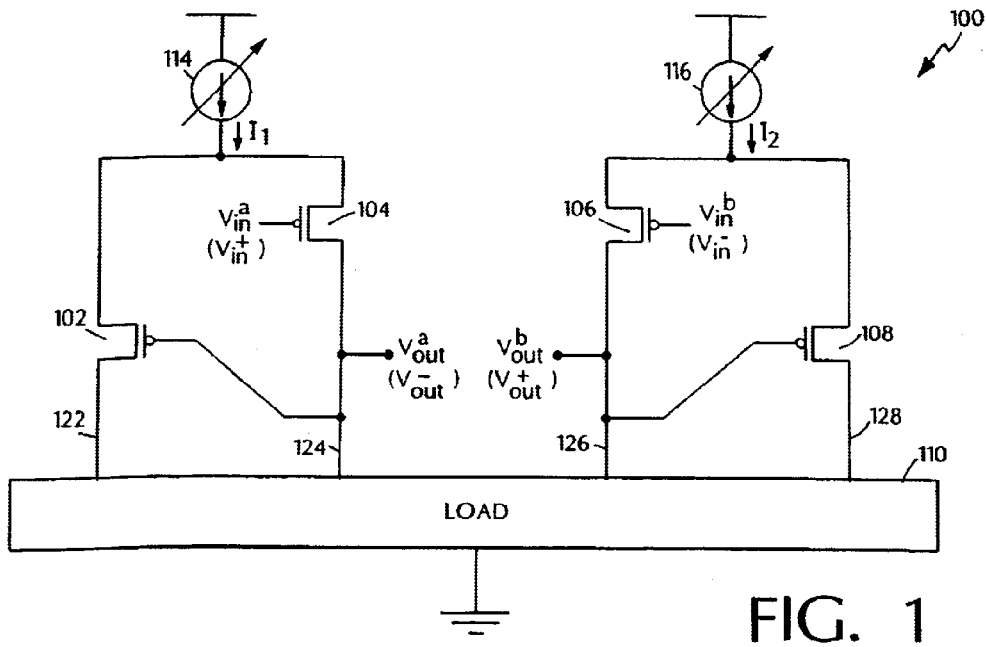
FIGS. 1–2 are schematic diagrams each showing an embodiment of an amplifier circuit in accordance with the invention.

An embodiment of an amplifier circuit 100 in accordance with the invention, shown in FIG. 1, includes a first differential transistor pair 102, 104, and a second differential transistor pair 106, 108. In this embodiment, the transistors of the differential pairs are implemented in p-channel metal oxide semiconductor field effect transistors (MOSFETs). Each differential transistor pair may be intentionally unbalanced. The unbalanced characteristic may be obtained by transistor 104 being sized differently from the transistor 102 by a factor of N in the width of the transistor channel. In this embodiment, N may be greater or less than one. For example, N may equal 0.1, 0.4, 0.8, 3, 8, etc. Also, transistor 106 has a different channel width than that of transistor 108, by the same factor N. The length of the transistor channels may be the same across all transistors in the amplifier circuit 100. The unbalanced characteristic may also be achieved by using different lengths and widths for the transistors as is known in the art, or by using a combination of length and width variations.

Figure 2:
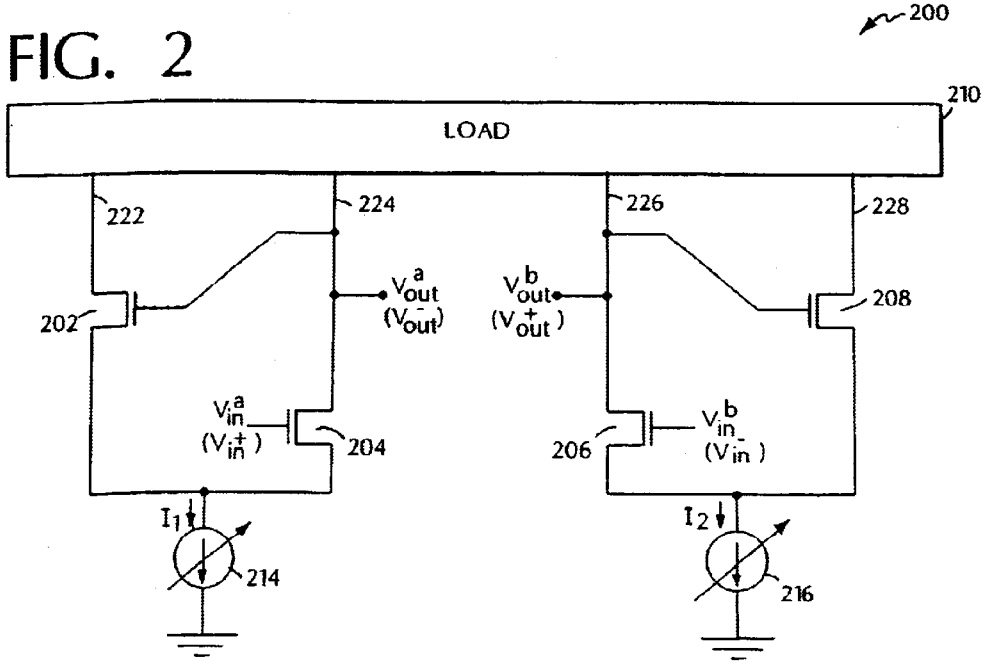

The respective tail currents ($I_1$ and $I_2$) of the differential pairs are controlled by current generators 114 and 116 as shown. In this embodiment, the current generators 114 and 116 are variable current generators that pass the tail currents of the respective differential pairs. Other types of current generators may alternatively be used, for example, current sinks, as shown in FIG. 2.

Returning to FIG. 1, the transistors 102, 104, 106 and 108 of the transistor pairs have their drain terminals (output nodes 122, 124, 126 and 128) coupled to load 110 and in turn to a voltage return (i.e. ground).

The amplifier circuit 100 provides output voltages $V_{out}^a$ and $V_{out}^b$ in response to the input voltages $V_{in}^a$ and $V_{in}^b$. Bias terminals (that is, the gate terminals in this embodiment) of first transistors 104 and 106 of the differential pairs receive input voltages $V_{in}^a$ and $V_{in}^b$, respectively. In this embodiment, because second transistors 102 and 108 do not receive input voltages $V_{in}^a$ and $V_{in}^b$ at their bias terminals, but instead only the first transistors 104 and 106 do, input capacitance is minimized, which enables greater responsivity of the amplifier circuit 100. The output nodes of these same first transistors 104 and 106 may serve as the amplifier output, $V_{out}^a$ and $V_{out}^b$. In an embodiment of the amplifier circuit, a difference output voltage $V_{out}^b - V_{out}^a$ (or $V_{out}^+ - V_{out}^-$ shown in parentheses in FIG. 1) is generated in response to a difference input voltage $V_{in}^a - V_{in}^b$ (or $V_{in}^+ - V_{in}^-$).

The transistors of the differential pairs are inter-coupled in a manner that provides positive feedback for additional gain. Specifically in the FIG. 1 embodiment, output node 124 of transistor 104 is coupled to the bias terminal (that is, the gate terminal) of transistor 102 of the same differential pair. Similarly, output node 126 of transistor 106 is coupled to the bias terminal of transistor 108 of the same differential pair. The gain of the amplifier circuit 100 is also determined in part by a variety of other factors, including the impedance $R_{load}$ of the load devices 110 at each node transistor output node 122, 124, 126 and 128, and the transconductance $g_m$ of each transistor in the first and second differential pairs.

Positive feedback in the amplifier circuit 100 is provided during operation of the amplifier circuit 100 as follows. Consider, for example, an embodiment where $V_{in}^a$ and $V_{in}^b$ are components of a differential signal $V_{in}^+$ and $V_{in}^-$. An increase in $V_{in}^+$ causes a decrease in the drain current for transistor 104 and thus a decrease in the voltage level of $V_{out}^-$. By virtue of $V_{out}^-$ being coupled to the gate terminal of transistor 102, a decrease in $V_{out}^-$ will result in an increase in drain current for transistor 102. Because $I_1$ remains constant during operation of circuit 100, the increase in the drain current of transistor 102 results in a further reduction in the drain current of transistor 104 and a resulting further reduction in $V_{out}^-$. Similarly, a decrease in $V_{in}^-$ (associated with the increase in $V_{in}^+$) causes an increase in $V_{out}^+$ and a decrease in drain current for transistor 108, resulting in a further increase in the drain current of transistor 106 and an increase in $V_{out}^+$.

An amplifier circuit having two differential pairs and a current generator for each pair as in FIG. 1 is also described in commonly assigned U.S. patent application Ser. No. 09/895,625 to Bryan K. Casper, entitled "Variable Offset Amplifier Circuit," filed on Jun. 29, 2001; commonly assigned U.S. patent application to James E. Jaussi and Bryan K. Casper, attorney docket No. 10559-556001/P12576, entitled "Variable Offset Amplifier Circuits and Their Applications," filed on even date; and commonly assigned U.S. patent application to James E. Jaussi and Bryan K. Casper, attorney docket No. 10559-555001/P12575, entitled "Positive and Negative Current Feedback to Vary Offset in Variable Offset Amplifier Circuits," filed on even date. Unlike the amplifier circuits of the present invention, however, the amplifier circuits shown in these other patent applications do not include the additional feature of positive feedback in the amplifier stage itself for increased gain. The positive feedback in the amplifier stage, enabled because of the presence of more than one current generator in the amplifier stage, provides for high gain without the need for gain coming from the load as is conventional. Although the invention provides that gain need not come from the load to have high gain, it is also contemplated that a high gain amplifier with positive feedback in gain in accordance with the invention may be combined with a load that provides additional positive feedback for even higher gain, as will be shown, for example, in FIGS. 5 and 6. In addition, as discussed previously, the invention in some embodiments provides minimized input capacitance because the input signal $V_{in}^a$ and $V_{in}^b$ is only received at the gate terminals of transistors 104 and 106.

Another feature of the embodiment shown in FIG. 1 is that offset may be varied by varying current generators 114 and 116. For example, tail currents $I_1$ and $I_2$ may have equal nominal current levels, and the offset may be varied by varying, during testing of the circuit for example, $I_1$ and $I_2$ in equal and opposite amounts from the nominal current level. In such an embodiment, an increase in $I_1$ with an associated decrease in $I_2$ causes a negative offset change on the output of $V_{out}^b - V_{out}^a$, whereas a decrease in $I_1$ with an associated increase in $I_2$ causes a positive offset change in the output of $V_{out}^b - V_{out}^a$. As such, an amplifier circuit having this variable offset feature may be employed to overcome process-induced variations in the structure of circuit devices, thus enabling smaller device sizes. Also, the variable offset feature provides for adjustability of the offset in applications where a specified offset is needed.

Referring now to FIG. 2, another embodiment of an amplifier circuit 200 in accordance with the invention is similar to the embodiment shown in FIG. 1, except that the FIG. 2 embodiment uses n-channel MOSFETs 202, 204 for the first differential pair and n-channel MOSFETs 206, 208 for the second differential pair. The current generators in this embodiment are current sinks 214 and 216 which control tail currents $I_1$ and $I_2$ of the differential pairs, respectively. Transistor output nodes 222, 224, 226, 228 are coupled to load 210, which in turn is coupled to a power supply node. Thus, in contrast to the embodiment of FIG. 1, the amplifier circuit 200 of FIG. 2 has its load 210 referenced to a power supply node rather than to a power return (e.g., ground) node. Similar to the FIG. 1 embodiment, in the FIG. 2 embodiment output node 224 of transistor 204 (that is, $V_{out}^a$) is coupled to the gate terminal of transistor 202 of the same differential pair, and output node 226 of transistor 206 (that is, $V_{out}^b$) is coupled to the gate terminal of transistor 208 of the same differential pair. Similar to how the FIG. 1 embodiment provides positive feedback and higher gain as described previously, the coupling of output nodes 224 and 226 as in the FIG. 2 embodiment provides positive feedback and higher gain.

Figure 3:
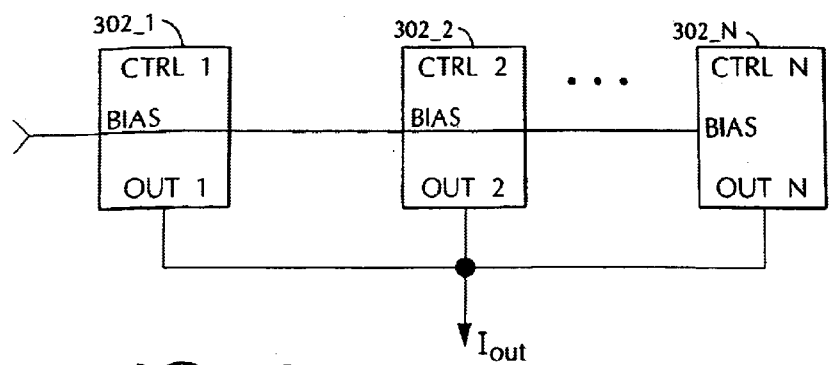
FIG. 3 is a schematic diagram of an embodiment of a current source that may be used with the circuit of FIG. 1.

Referring to FIG. 3, this figure depicts a circuit schematic of an embodiment of a digitally controllable current source that can be used in place of the variable current generator 114 or 116 of FIG. 1. This current source has a number of digitally variable current cells 302_1, 302_2 . . . 302_N that are coupled in parallel to provide their individual currents which are summed to yield $I_{out}$. This output current $I_{out}$ may be the tail current of a differential transistor pair. Each individual cell current may be adjusted by varying a bias level in each cell, for example, using a binary weighted current set by a current mirror (not shown). The individual cell current may be turned on or off in response to a signal at a control input CTRL as shown. This control signal may be digital in nature, that is have one of two stable states corresponding to two levels of current at each individual cell's output. The total current may thus be adjusted by setting a digital value at the control inputs of the individual cells 302.

It should be noted that the output currents provided by the individual cells 302 may be unbalanced. For instance, some of the cells may provide larger currents (for course granularity control of the output current) while others may provide smaller currents (for fine granularity control of the output current $I_{out}$). Use of such digitally controllable current sources allows the offset of the amplifier circuit in FIG. 1 to be trimmed digitally, by selecting the desired offset according to a multi-bit digital value.

Figure 4:
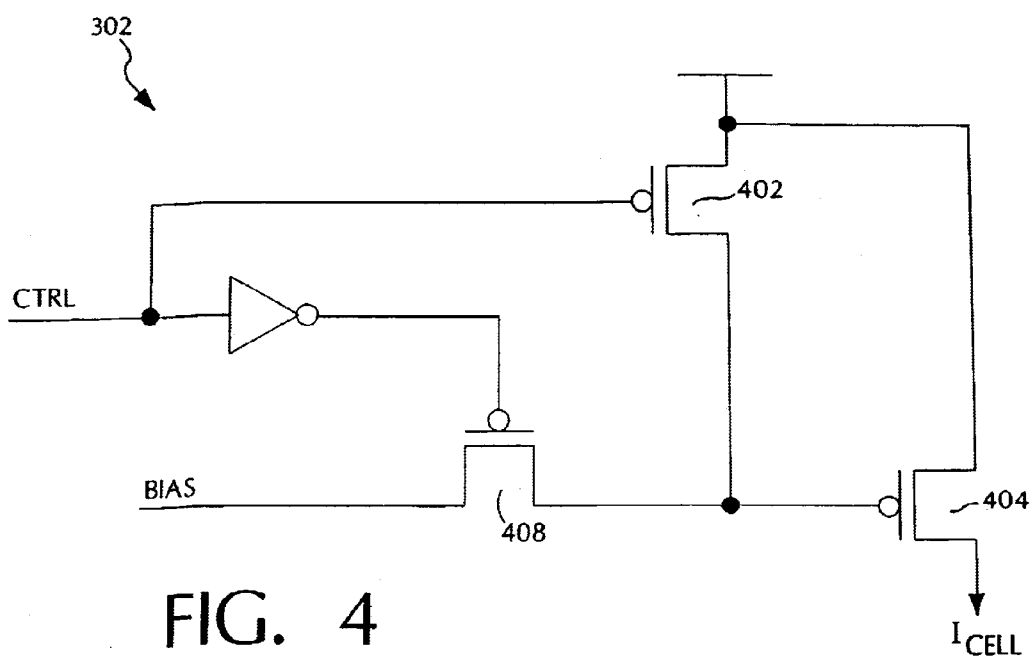
FIG. 4 is a schematic diagram of an embodiment of current source cell that may be used with the current source of FIG. 3.

FIG. 4 shows a circuit schematic of an embodiment of a digitally controllable current source cell 302. When the input signal at CTRL is at a relatively high voltage, such that the p-channel transistor 404 is biased according to an input bias signal at BIAS via p-channel transistor 408. In the other state, i.e., when the input signal at CTRL drops to a relatively low voltage such that p-channel transistor 402 has its channel inverted, the gate of the p-channel transistor 404 is pulled to a relatively high voltage that is sufficient to, in this embodiment, place the transistor 404 in cutoff. Thus, two different levels of cell current $I_{cell}$, e.g., "on" and "off," are obtained in response to the input control signal at CTRL. As mentioned in the previous paragraph, the various cells may be designed to provide different levels of "on" currents so that some may be used for fine granularity control of the total current $I_{out}$ (see FIG. 3) while others may be used for relatively course granularity control of this output current. Referring back to FIG. 4, the varying levels of "on" currents may be achieved by sizing the transistor 404 as known to those of ordinary skill in the art.

Figure 5:
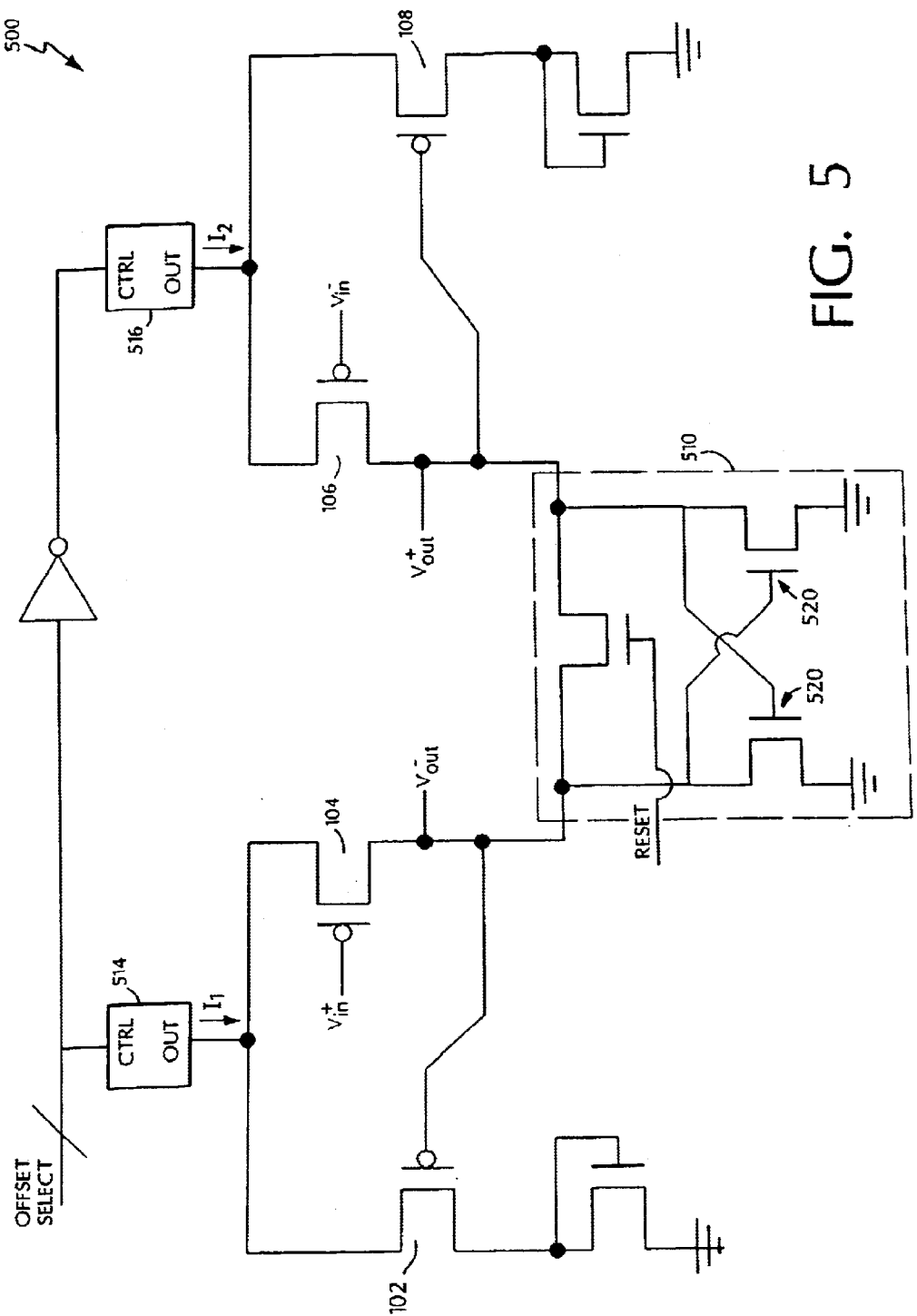
FIG. 5 is a schematic diagram of an embodiment of a variable offset comparator circuit in accordance with the invention.

FIG. 5 shows an embodiment of a digitally controllable variable offset comparator circuit 500 in accordance with the invention. The comparator circuit 500 includes an amplifier circuit substantially as shown in FIG. 1, including the first and second differential pairs which are defined by transistors 102, 104 and 106, 108, respectively. The variable current generators 514 and 516 are also coupled to control the tail currents $I_1$ and $_2$ of the respective differential pairs. The current generators 514, 516 are controlled by a digital value that is received on multiple, offset select lines as shown. In this embodiment, each digital value of the offset corresponds to two oppositely varying tail currents $I_1$ and $I_2$ that are equidistant from a nominal tail current. This configuration is similar to the example given above in connection with FIG. 1 which helped explain the availability of opposite polarity offset using the amplifier circuit.

A single ended output voltage for this comparator circuit 500 may be available as either $V_{out}^+$ or $V_{out}^-$. To help drive these output signals into one of two possible stable states, a regenerative latch circuit 510 may be provided as shown. However, in other embodiments, the regenerative latch circuit 510 may be replaced with a linear load having only passive components, because of the gain provided within the amplifier stage as previously described in connection with FIGS. 1–2.

Returning now to FIG. 5, after being reset by an input signal (RESET), the regenerative latch circuit 510 will quickly amplify any difference between $V_{out}^+$ and $V_{out}^-$, where such amplification occurs at an even higher gain due to the cross-coupled n-channel pair 520, thereby ensuring that the output signals $V_{out}^+$ and $V_{out}^-$ only assume one of two possible stable states. Thus, if $V_{in}^+$ is greater than $V_{in}^-$ by at least the amount of offset that has been set (for example, set by adjusting $I_1$ and $I_2$ as previously described), then the regenerative latch circuit 510 assists in forcefully driving $V_{out}^+$ to a high voltage level. Other types of regenerative latch circuits may be used to provide the digital type output signal typically associated with a sense amplifier for a comparator application. For example, the regenerative latch circuit may include the cross-coupled n-channel pair 520 coupled in parallel with a cross-coupled p-channel pair (not shown).

The variable offset comparator circuit 500 shown in FIG. 5 may behave as a sense amplifier which detects small differences between two analog signals $V_{in}^+$ and $V_{in}^-$. In such an application, a differential signal is sensed, where the differential signal is applied to transistors 104 and 106.

Figure 6:
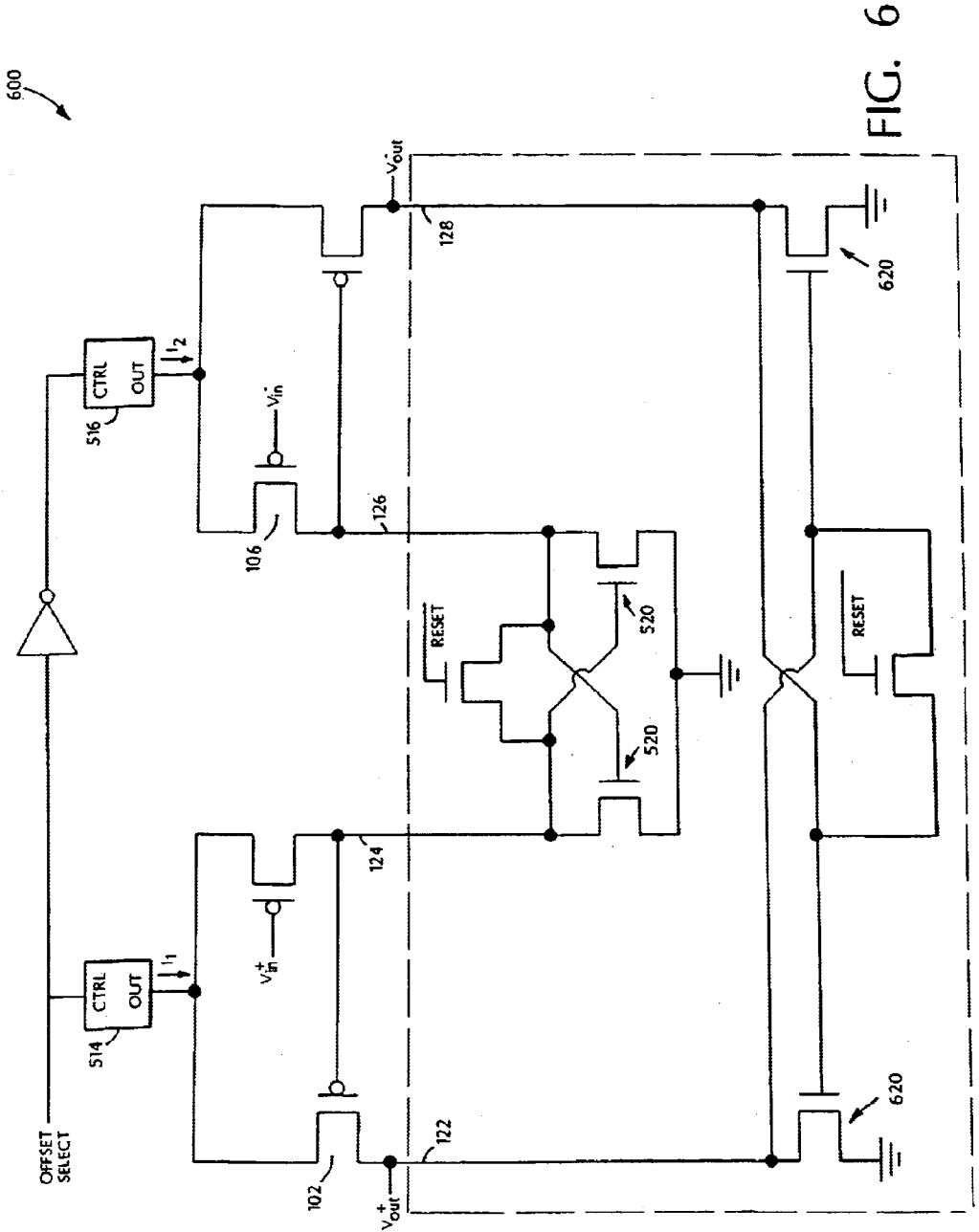
FIG. 6 is a schematic diagram of another embodiment of a variable offset comparator in accordance with the invention.

FIG. 6 shows another embodiment of a digitally controllable variable offset comparator circuit 600 in accordance with the invention. In this embodiment, output nodes 122 and 128 of transistors 102 and 108 serve as the outputs $V_{out}^+$ and $V_{out}^-$ of the comparator circuit 600, as opposed to output nodes 124 and 126 of transistors 104 and 106 as in the FIG. 5 embodiment. In addition, load circuit includes, connected to nodes 122 and 128, an additional regenerative latch circuit that consists of cross-coupled n-channel pairs 620.

Figure 7:
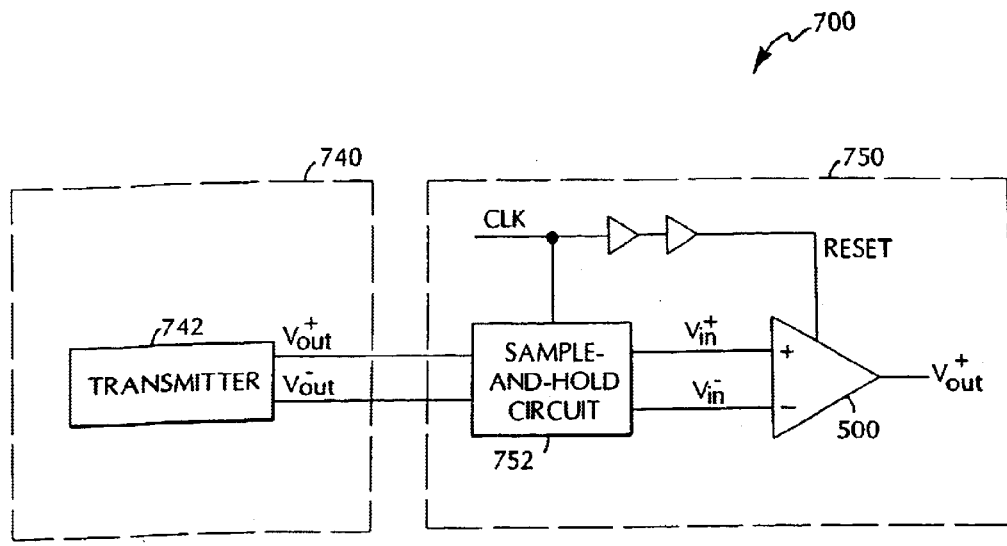
FIG. 7 is a block diagram of a communications system applying the comparator circuit of FIG. 5.

FIG. 7 shows a communications system 700 having the comparator circuit 500 of FIG. 5 (or alternatively the comparator circuit 600 of FIG. 6) in a sense amplifier application. The transmission end of the communication system 700 may reside on a separate integrated circuit die or separate circuit board, for example, as depicted by block 740 having a transmitter 742 with differential outputs $V_{out}^+$ and $V_{out}^-$. These differential output signals are received by a sample-and-hold circuit 752 that may reside, as shown in FIG. 7, on a separate integrated circuit die or separate board as depicted by block 750. A clock signal CLK determines the timing of when the differential signal is sampled, and a delayed clock signal RESET determines the timing of when the sampled-and-held differential signal is compared by comparator circuit 500. If $V_{in}^+$ is greater than $V_{in}^-$ by at least the amount of offset that has been selected, then the output $V_{out}^+$ of the comparator circuit 500 will be driven to a high voltage level.

Figure 8:
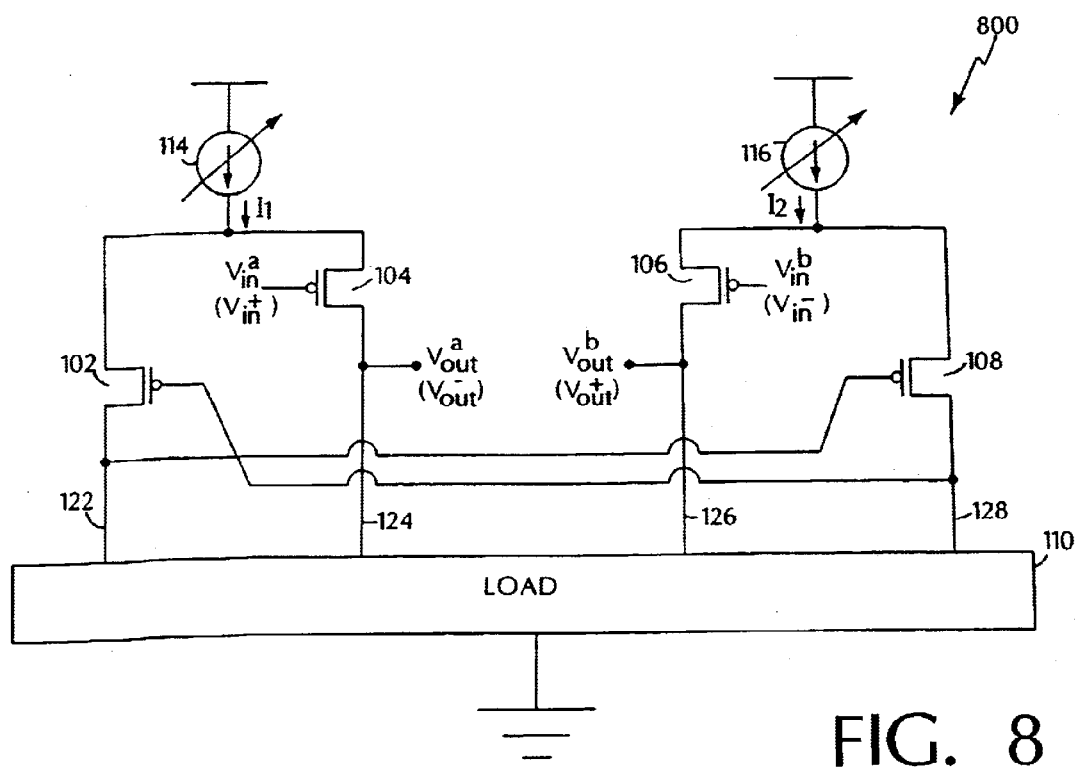
FIG. 8 is a schematic diagram showing an embodiment of an amplifier circuit in accordance with the invention.

A number of embodiments of the invention have been described. Nevertheless, it will be understood that various modifications may be made without departing from the spirit and scope of the invention. For example, as shown in the amplifier circuit 800 of FIG. 8, instead of providing the positive feedback in gain as shown in FIGS. 1–7, the positive feedback in gain may be provided by coupling the output node 128 of transistor 108 to the gate terminal of transistor 102 and coupling the output node 122 of transistor 102 to the gate terminal of transistor 108. Accordingly, other embodiments are within the scope of the following claims.

What is claimed is:

1. A comparator circuit comprising:
   (a) a pro-amplifier circuit comprising:
      (1) first and second transistor pairs, each pair having a first transistor and a second transistor of like conductivity type and a bias terminal and an output node for each transistor, the bias terminals of the first transistors serving as inputs for the pro-amplifier circuit, and the output node of each first transistor being respectively coupled to the bias terminal of the second transistor of the same transistor pair for positive feedback in gain; and
      (2) first and second current generators to control respective tail currents of the first and second transistor pairs; and
   (b) a load circuit coupled to the output nodes of the first transistors of the pre-amplifier circuit.

2. The comparator circuit of claim 1, wherein the load circuit is a regenerative latch circuit.

3. The comparator circuit of claim 2, further comprising a regenerative latch circuit coupled to the output nodes of the second transistors of the pro-amplifier circuit.

4. The comparator circuit of claim 1, wherein the load circuit comprises only passive components.

5. The comparator circuit of claim 1, wherein the first transistors of each pair are larger than the second transistor for the same pair.

6. The comparator circuit of claim 1, wherein the first and second current generators are variable current generators whose current levels may be set during testing of the pre-amplifier circuit.

7. The comparator circuit of claim 1, wherein the first and second transistors of each transistor pair are MOSFETS with source, drain and gate terminals; the output nodes of the transistors are the drain terminals; the bias terminals of the transistors are the gate terminals; the first current generator is coupled to the source terminals of the first and second transistors of the first transistor pair; and the second current generator is coupled to the source terminals of the first and second transistors of the second transistor pair.

8. The comparator circuit of claim 7, wherein the drain terminal of each first transistor serves as an output for the pre-amplifier circuit.

9. The comparator circuit of claim 7, wherein the drain terminal of each second transistor serves as an output for the pre-amplifier circuit.

10. The comparator circuit of claim 7, wherein the MOSFETs are p-channel MOSFETs.

11. A communications system comprising:
(a) a transmitter producing a differential voltage signal;
(b) a receiver comprising:
  (1) a sample-and-hold circuit that receives the differential voltage signal and samples and holds values of the differential voltage signal; and
  (2) a comparator circuit comprising:
    (i) a pre-amplifier circuit comprising:
      (a) first and second transistor pairs, each pair having a first transistor and a second transistor and a bias terminal and an output node for each transistor, the bias terminals of the first transistors serving as inputs for the pre-amplifier circuit, and the output node of each first transistor being respectively coupled to the bias terminal of the second transistor of the same transistor pair; and
      (b) first and second current generators to control respective tail currents of the first and second transistor pairs; and
    (ii) a load circuit coupled to the output nodes of the first transistors of the pre-amplifier circuit.

12. The communications system of claim 11, wherein the transmitter and the receiver reside on different circuit boards.

13. The communications system of claim 11, wherein the transmitter and the receiver reside on different integrated circuit die.

14. The communications system of claim 11, wherein the load circuit is a regenerative latch circuit.

15. The communications system of claim 11, wherein the load circuit comprises only passive components.

16. The communications system of claim 11, wherein the first and second current generators are variable current generators whose current levels may be set during testing of the pro-amplifier circuit.

17. The communications system of claim 11, wherein the output node of each first transistor serves as an output for the pre-amplifier circuit.

* * * * *